United States Patent [19]

Kudo

[11] Patent Number: 5,218,231
[45] Date of Patent: Jun. 8, 1993

[54] MOLD-TYPE SEMICONDUCTOR DEVICE

[75] Inventor: Yoshimasa Kudo, Yokohama, Japan

[73] Assignee: Kabushiki Kaisha Toshiba, Kawasaki, Japan

[21] Appl. No.: 571,972

[22] Filed: Aug. 24, 1990

[30] Foreign Application Priority Data

Aug. 30, 1989 [JP] Japan .................. 1-223865

[51] Int. Cl.⁵ .................. H01L 23/48; H01L 23/50
[52] U.S. Cl. .................. 257/735; 257/727; 257/723
[58] Field of Search .......... 357/68, 69, 79, 75, 357/76; 257/735, 727, 723

[56] References Cited

U.S. PATENT DOCUMENTS

| | | | |
|---|---|---|---|
| 3,995,310 | 11/1976 | Koenig | 357/79 |
| 4,500,907 | 2/1985 | Takigami et al. | 357/79 |
| 4,607,277 | 8/1986 | Hassan et al. | 357/79 |
| 4,724,474 | 2/1988 | Duchek et al. | 357/69 |
| 4,768,075 | 8/1988 | Broich et al. | 357/75 |
| 4,935,803 | 6/1990 | Kalfus et al. | 357/69 |

FOREIGN PATENT DOCUMENTS 60-101958 6/1985 Japan .
63-150954 6/1988 Japan .

Primary Examiner—William Mintel
Assistant Examiner—S. V. Clark
Attorney, Agent, or Firm—Finnegan, Henderson, Farabow, Garrett & Dunner

[57] ABSTRACT

A semiconductor device comprises a semiconductor element having a PN junction, a first connector having a first connection surface rising in an embossing manner, connected to a first surface of the semiconductor element via a solder layer at the first connection surface, a second connector having a second connection surface rising in an embossing manner, connected to a second surface of the semiconductor element via a solder layer at the second connection surface.

26 Claims, 5 Drawing Sheets

MOLD-TYPE SEMICONDUCTOR DEVICE

BACKGROUND OF THE INVENTION

1. Field of the Invention

The present invention relates to a mold-type semiconductor device for power rectifying and, more particularly to a semiconductor device constituting a bridge circuit.

2. Description of the Related Art

In a mold-type semiconductor device for power rectifying in which a bridge circuit is used, the bridge circuit, which is formed of the so-called Mesa-type diode or a Planer-type diode, is used. Regarding its assembly system, a method using a lead frame has been employed after many changes. Such a mold-type semiconductor device for power rectifying will be explained with reference to FIG. 1 (perspective view), FIG. 2 (cross sectional view taken along lines A—A of FIG. 1), FIG. 3 (cross sectional view showing the structure of a semiconductor element) and FIG. 9 showing a bridge circuit. In other words, a planer-type or a mesa-type diode, which is used as a semiconductor element constituting the bridge circuit, is applied.

The planer type, which is shown in FIG. 3, will be explained. N- and P-type impurity regions 1 and 2, which show an opposite polarity necessary for the diode, are formed in a silicon semiconductor substrate (not shown) constituting a semiconductor element. Moreover, an N+ region 3 is described. The N+ region 3 serves as an isolation region, which is necessary for forming a number of planer-type semiconductor elements in the semiconductor substrate. Also, in the N+ region 3, a braking process is performed along a dicing line (not shown), which is formed in N+ region 3, thereby forming an individual semiconductor element.

As shown in the drawing, conductive metal layers 4 and 5 are coated on P+ region 2 and N+ region 3, thereby forming electrode layers 4 and 5. In addition, thermal oxidation film 6 is coated by normal thermal oxidation method, thereafter a patterning is performed by a photolithography. Moreover, junction end portions 7 and 8 are exposed to the surface of the semiconductor substrate.

The mesa-type semiconductor element features junction end portions (not shown) which are exposed to the mesa-shaped portion. In other words, an inclined surface, which has a positive bevel in the direction of the thickness of the semiconductor substrate, a negative bevel, or both bevels, is formed by mechanical means, chemical means, or means combining both means. Then, the junction end portions, which are exposed to the inclined surface and which are indispensable for the diode, are normally coated and protected with an encape material such as silicon rubber.

The mold-type semiconductor device, which constitutes a bridge circuit by a plurality of diodes having the above-mentioned structure, has been on sale. The system using the so-called lead frame is employed as an assembly process. This will be explained with reference to FIG. 1 (perspective view), FIG. 2 (cross sectional view taken along lines A—A of FIG. 1).

A connector 10 is integrally fixed to an inner lead 9 by a solder layer 12. Four planer-type or mesa-type semiconductor elements 13, which are necessary for the bridge circuit, is secured to the connector 10 via the solder layer 12. Moreover, in the connectors 10, 10, to which semiconductor elements 13 are fixed, rear electrodes 5, 5 of the semiconductor elements 13, 13 are fixed to a die stage 15, which is formed in a lead frame 14, via the solder layer 12 to be opposite to each other.

Then, a mold layer is coated by the mold process of the well-known transfer mold method, thereby forming a mold-type semiconductor device for power rectifying.

SUMMARY OF THE INVENTION

An object of the present invention is to prevent P+ and N+ electrodes from being short-circuited due to the extension of soldering, and prevent the semiconductor element from being cracked due to the uneven solder distribution.

The present invention provides a semiconductor device, which comprises a semiconductor element (20) having a PN junction; a first forming lead connector (25) connected to a first surface of the semiconductor element (20) via a solder layer (26) and having a connection surface rising in an embossing manner; and a second connector (22) connected to a second surface of the semiconductor element (20) via the solder layer (26) and having a connection surface rising in an embossing manner.

According to the above-mentioned structure, the distribution of the soldering portion, which is the solder layer (26), does not exceed emboss portions (30a, 30b) by the surface tension, and the same distribution as the upper surface of the emboss portion can be seen. Therefore, P+ and N+ electrodes can be prevented from being short-circuited due to the extension of soldering. Moreover, since the range of the distribution of the solder layer (26) is defined, the area of the solder layer of the first surface is the same as that of the second surface. Therefore, the same influence is exerted on the semiconductor elements by the soldering of the first surface and that of the second surface. For this reason, the semiconductor element can be prevented from being cracked.

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 5:
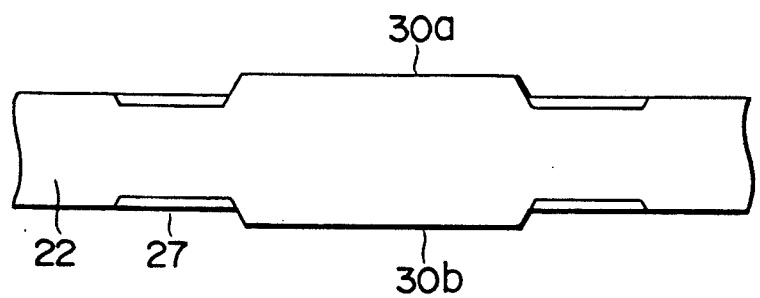
Figure 6:
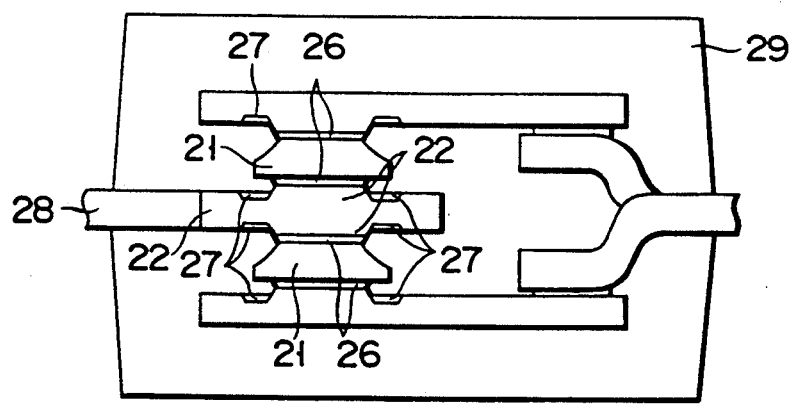

An embodiment of the present invention will be explained with reference to FIGS. 4 to 6. In this case, a planer-type diode 20 is explained in FIG. 4 and a mesa-type diode 21 is explained in FIG. 6. The mesa-type diode will be first explained.

Figure 3:
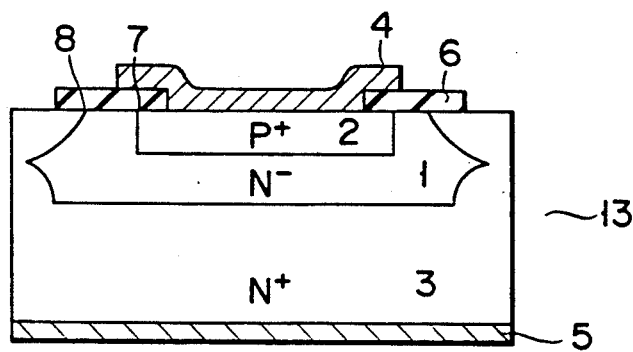
FIG. 3 is a cross sectional view of a planer-type diode.

A window is formed in a thermal oxidation film, which is coated on the surface of N-type silicon semiconductor substrate by the normal method as is obvious from FIG. 3, by performing a patterning process of the photolithography method. Thereafter, a P+ type region is formed by the diffusion of impurity material of an opposite conductive type, for example, B or an ion-implantation and a junction is also formed. As a feature of the mesa-type structure, the junction end is introduced in the direction of the thickness of the silicon semiconductor substrate. Moreover, though it is not illustrated, an inclined surface having a positive bevel, or a negative bevel, or both bevels, is formed in the direction of the thickness of the silicon semiconductor substrate to cross the junction end portions, thereby satisfying pressure characteristic. The inclined surface is, of course, protected by performing an encape processing of material such as silicon rubber.

Since the angle and direction of the inclined surface is determined the element characteristic, that is, pressure to be obtained, impurity concentration of each region, they are not unconditionally determined. In contrast, since the planer-type diode 20 has the structure as shown in FIG. 3, the explanation thereof will be omitted.

Figure 4:
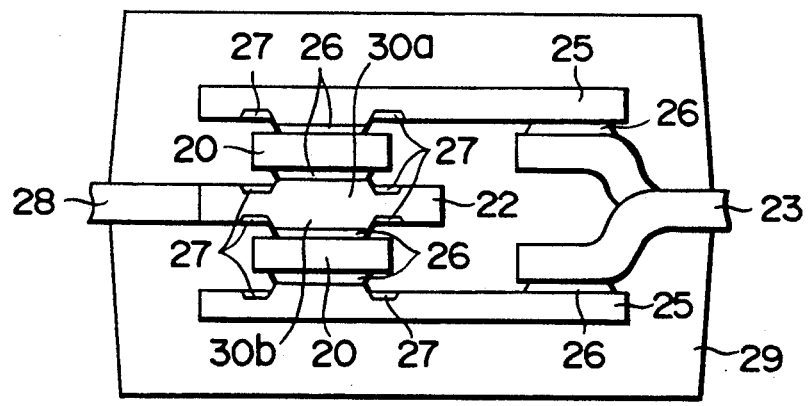
FIGS. 4 to 6 are perspective views of a mold-type semiconductor device for power rectifying according to one embodiment of the present invention.

According to the present invention, in FIG. 4, the planer-type diode 20 or the mesa-type diode 21, which is a semiconductor element, is provided on a forming lead connector 25, which is integrally fixed to an inner lead 23 comprising a die stage 22 formed on the lead frame and a part of a connector 23, via a solder layer, that is, a first solder layer 26. The present invention is characterized in that both upper and lower forming lead connectors 25 form embosses which will be explained later. In other words, as shown in FIG. 5, for example, a press processing is added to copper and copper alloy, a lead frame 28 for DIP (Dual in Line Package) is used. The quality and shape of the lead frame 28 are not limited to copper and copper alloy. The lead frame 28 may be made of the mixture of DIP and SIP (Single In Line Package), or iron, alloy of iron and nickel. The outside of the predetermined position where the die stage 22 is formed is plasticized and the metallic material is moved, thereby forming annular level difference portion 27 and embosses 30a and 30b (see FIG. 5 and the die stage portion is described as a die stage thereafter). The elevations of these embodiments are the same as FIG. 1 other than the characterized portion of the present invention.

The planer-type diode 20 for a bridge circuit, which is necessary for the mold-type semiconductor device for power rectifying, is assembled by the lead frame 28 and the forming lead connector 25. In this case, at least four planer-type diodes 20 are used to form the bridge circuit. Due to this, as shown in FIG. 4, the forming lead connector 25, to which the single planer-type diode 20 is fixed by the solder layer, that is, the second solder layer 26, is integrated with the inner lead 23.

After such an assembly process is finished, a mold layer 29 is coated by the transfer mold method, thereby completing the mold-type semiconductor device for power rectifying. FIG. 6 shows the cross sectional view of the mold-type semiconductor device for power rectifying using four mesa-type diodes 21. However, since FIG. 6 is completely the same as FIG. 4 other than the type of diode, the explanation thereof will be omitted.

Figure 1:
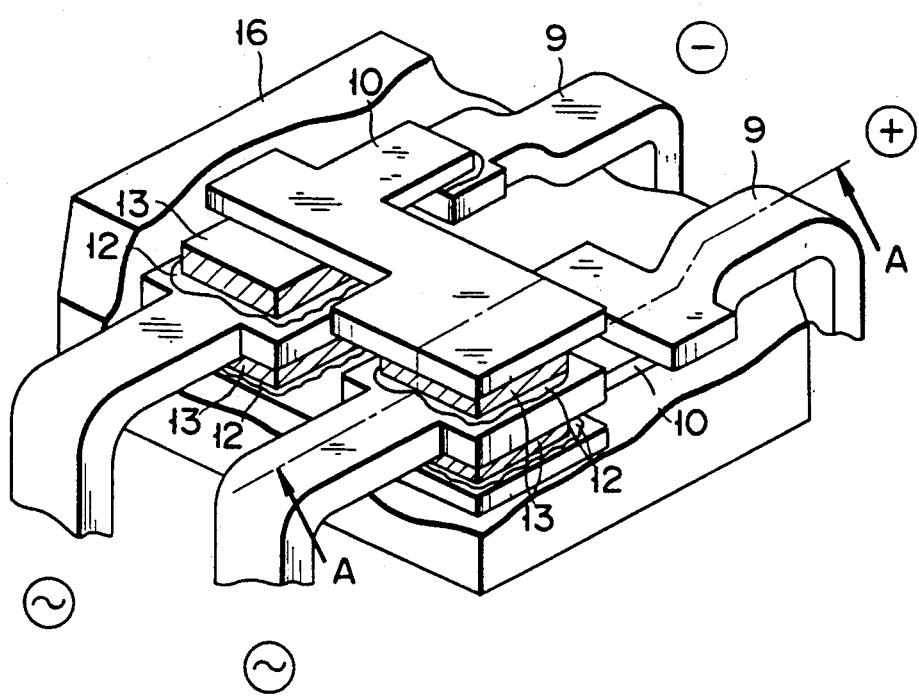
FIG. 1 is a perspective view of a mold-type semiconductor device for power rectifying to which the present invention is not applied.
Figure 2:
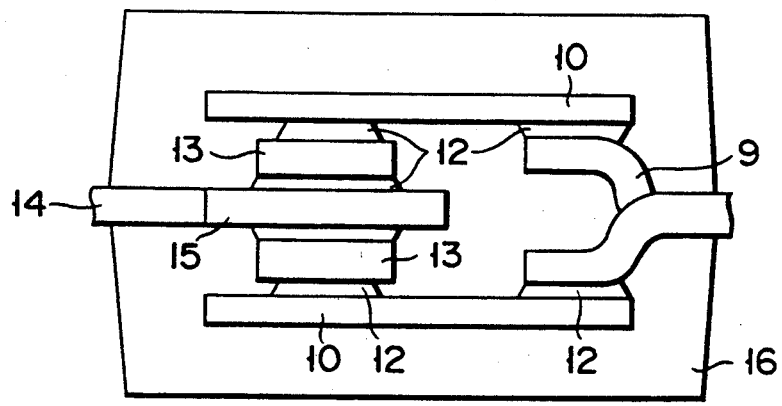
FIG. 2 is a perspective view of FIG. 1.

Additionally, the state of the completed mold-type semiconductor device for power rectifying is the same as the device of FIG. 1.

Figure 7:
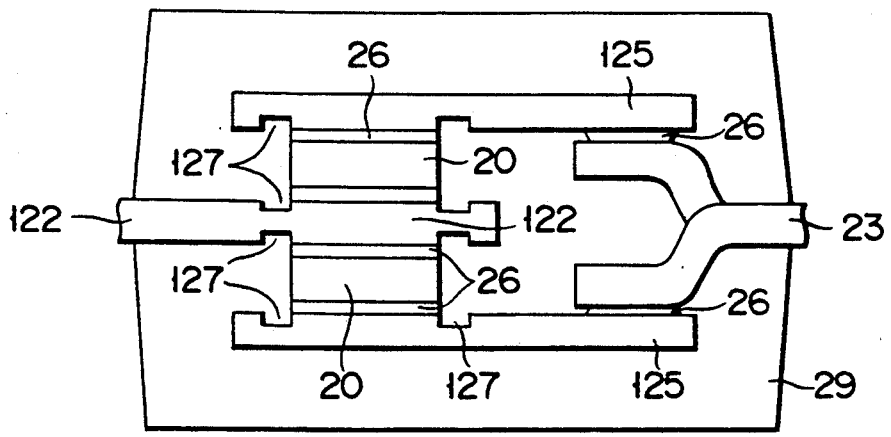
FIGS. 7 and 8 are perspective views showing other embodiments of the present invention.
Figure 8:
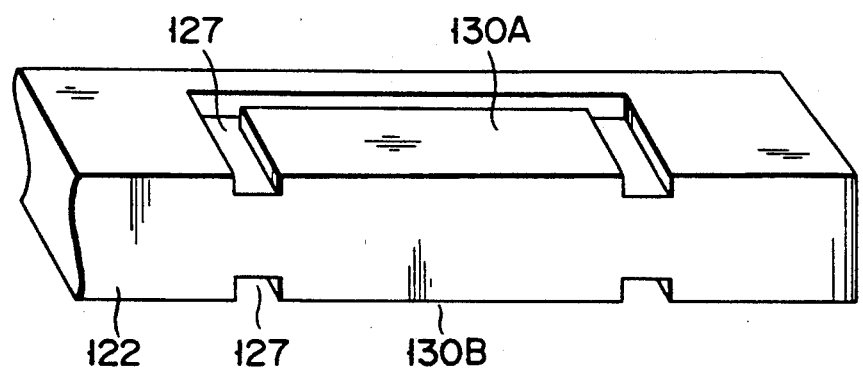
Figure 9:
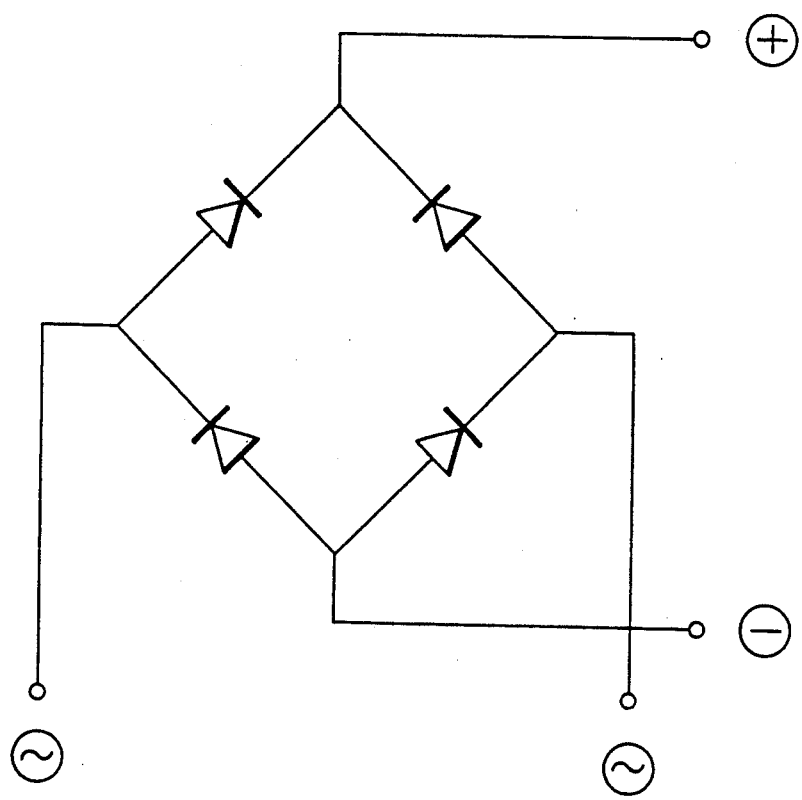
FIG. 9 is a circuit diagram showing an equivalent circuit of the mold-type semiconductor device for power rectifying of the present invention.

FIGS. 7 and 8 are perspective views showing other embodiments of the present invention, and FIG. 9 is a circuit diagram showing an equivalent circuit of the mold-type semiconductor device for power rectifying of the present invention.

According to the present invention, the planer-type diode 20, which is a semiconductor element, is provided on a forming lead connector 125, which is integrally fixed to an inner lead comprising a die stage 122 formed on the lead frame and a part of a connector 23, via a solder layer, that is, a first solder layer 26. The present invention is characterized in that both upper and lower forming leads 125 form groove 127 which will be explained later. The die stage has two connection surfaces 130A and 130B. In other words, as is obvious from FIG. 8, for example, a press processing is added to copper and copper alloy, the lead frame 128 for DIP (Dual in Line Package) having the groove 127 is used. The quality and shape of the lead frame 128 are not limited to copper and copper alloy. The lead frame 128 may be made of the mixture of DIP and SIP (Single In Line Package), or iron, alloy of iron and nickel. By the groove 127 formed in the die stage 122 or the forming lead 125, a difference in level is generated between the surface to which the semiconductor element 20 is connected and the surface to which no semiconductor element 20 is connected. Moreover, similar to the above-mentioned emboss portions, the distribution of the solder layer 26, which is provided between the semiconductor elements, can be limited to the portion which is surrounded with the groove by the function of the surface tension of solder. At this time, if the connection region, which is formed by the groove 127, is made the same as the connection region of the semiconductor elements 20 or wider than that, stabler connection can be obtained.

Moreover, as shown in FIG. 8, if the distribution of the connection surfaces 130A and 130B is made the same as that of the connection surface which is formed by the groove of the forming lead connector 125 connected to the opposite side of the semiconductor elements 20, the same influence is exerted on the upper and lower surfaces of the semiconductor elements 20 by soldering. Thereby, the stable connection can be obtained, and the semiconductor elements can be prevented from being cracked.

As mentioned above, according to the present invention, when the diode is fixed to the die stage by soldering, the extension of soldering can be limited within the range of the emboss or the portion surrounded by the groove. For this reason, the solder layer integrally formed with P electrode of the diode, that is the semiconductor element, can be prevented from flowing into N+ region. Therefore, thermal fatigue problems of the semiconductor element, that is, the mold-type semiconductor device for power rectifying, can be improved by increasing the soldering portion.

Moreover, the range of the thermal change layer, which is formed between the solder layers fixed to the electrode provided on both surfaces of the semiconductor elements using the semiconductor substrate, can be substantially constantly controlled. Therefore, crack caused by stress generated by the difference in the area receiving the thermal change can be prevented. It can be added that such advantages can be obtained regardless of the difference between the planer type and the mesa type.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device, comprising:
   a first semiconductor element having a PN junction;
   a second semiconductor element having a PN junction; and
   a die stage having raised first and second connection surface areas;
   means for forming a difference in level between said die stage and each said first and second connection surface areas, said first and second connection surface areas each being located on opposite sides of said die stage, and said difference level forming means including a groove surrounding each said first and second connection surface areas of said die stage; and
   a layer of solder connecting each said first and second semiconductor elements respectively to said first and second connection surface areas.

2. A semiconductor device according to claim 1, wherein at least one of said first and second semiconductor elements is a mesa type.

3. A semiconductor device according to claim 1, wherein at least one of said first and second semiconductor elements is a planar type.

4. A semiconductor device according to claim 1, wherein said semiconductor device is molded in its outside with resin.

5. A semiconductor device according to claim 1, wherein said first and second connectors include copper.

6. A semiconductor device according to claim 1, wherein said die stage includes copper alloy.

7. A semiconductor device according to claim 1, wherein said first and second connection surface areas of said die stage are substantially the same in dimension and configuration.

8. A bridge type diode rectifier apparatus, comprising:
   a first semiconductor element having a PN junction;
   a second semiconductor element having a PN junction;
   a first die stage having raised first and second connection surface areas;
   first means for forming a difference in level between said first die stage and each said first and second connection surface areas, said first and second connection surface areas each being located on opposite sides of said first die stage, and said first difference level forming means including a first groove surrounding each said first and second connection surface areas of said first die stage;
   a first layer of solder connecting each said first and second semiconductor elements respectively to said first and second connection surface areas;
   a third semiconductor element having a PN junction;
   a fourth semiconductor element having a PN junction;
   a second die stage having raised third and fourth connection surface areas;
   second means for forming a difference in level between said second die stage and each said third and fourth connection surface areas, said third and fourth connection surface areas each being located on opposite sides of said second die stage, and said second difference level forming means including a second groove surrounding each said third and fourth connection surface areas of said second die stage;
   a second layer of solder connecting each said third and fourth semiconductor elements respectively to said third and fourth connection surface areas;
   a first connector connected to sides of said first and third semiconductor elements opposite said first and third connection surface areas, respectively; and
   a second connector connected to sides of said second and fourth semiconductor elements opposite said second and fourth connection surface areas, respectively;
   whereby said semiconductor elements and said connectors form a diode bridge circuit.

9. The bridge type diode rectifier according to claim 8, wherein at least one of said first and second semiconductor elements is a mesa type.

10. The bridge type diode rectifier according to claim 8, wherein at least one of said first and second semiconductor elements ia a planar type.

11. The bridge type diode rectifier according to claim 8, wherein said semiconductor device is molded on an outer side of said semiconductor device with resin.

12. The bridge type diode rectifier according to claim 8, wherein each said first and second die stage and said first and second connector includes copper.

13. The bridge type diode rectifier according to claim 8, wherein said first and second die stages and said first and second connectors include copper alloy.

14. The bridge type diode rectifier according to claim 8, wherein said first and second connection surface areas of said first die stage are substantially the same in dimension and configuration, and said third and fourth connection surface areas of said second die stage are substantially the same in dimension and configuration.

15. The semiconductor device according to claim 1, wherein said means for forming the difference in level between said die stage and said surface areas is plasticized.

16. The semiconductor device according to claim 1, wherein said raised first and second connection surface areas are defined by embossed surface areas formed on the opposite sides of the die stage.

17. The semiconductor device according to claim 16, wherein said means for forming the difference in level between the die stage and each of the first and second connection surface areas forms an annular level difference.

18. The semiconductor device according to claim 1, wherein said groove extends immediately from each said first and second surface areas.

19. The bridge type diode rectifier according to claim 8, wherein said first means for forming the difference in level between said first die stage and each said first and second surface areas is plasticized.

20. The bridge type diode rectifier according to claim 8, wherein said second means for forming the difference in level between said second die stage and each said third and fourth surface areas is plasticized.

21. The bridge type diode rectifier according to claim 8, wherein said raised first and second connection surface areas are defined by embossed surface areas formed on the opposite sides of the first die stage.

22. The bridge type diode rectifier according to claim 21, wherein said first means for forming the difference in level between the first die stage and each of the first and second connection surface areas forms an annular level difference.

23. The bridge type diode rectifier according to claim 8, wherein said raised third and fourth connection surface areas are defined by embossed surface areas formed on the opposite sides of the second die stage.

24. The bridge type diode rectifier according to claim 23, wherein said second means for forming the difference in level between the second die stage and each of the third and fourth connection surface areas forms an annular level difference.

25. The bridge type diode rectifier according to claim 8, wherein said first groove extends immediately from each said first and second surface areas.

26. The bridge type diode rectifier according to claim 8, wherein said second groove extends immediately from each said third and fourth surface areas.

* * * * *